United States Patent
Markwardt et al.

(10) Patent No.: US 6,477,047 B1
(45) Date of Patent: Nov. 5, 2002

(54) TEMPERATURE SENSOR MOUNTING FOR ACCURATE MEASUREMENT AND DURABILITY

(75) Inventors: Doug Markwardt, Cedar Park, TX (US); Thomas P. Dolbear, Austin, TX (US); Lewis M. Eyman, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 4 days.

(21) Appl. No.: 09/734,442

(22) Filed: Dec. 11, 2000

Related U.S. Application Data
(60) Provisional application No. 60/250,275, filed on Nov. 30, 2000.

(51) Int. Cl.[7] .................................................. H05K 7/20
(52) U.S. Cl. ...................... 361/704; 361/702; 361/710; 165/80.3; 257/713
(58) Field of Search ................................ 361/679, 683, 361/685, 686–690, 699, 704, 707, 717–721, 724–729, 752, 754, 756; 165/80.2, 80.3, 80.4, 165, 185, 263; 257/706–727; 312/223.2; 340/586, 606, 611, 599, 595, 653, 521; 364/185; 219/496, 206, 210, 497, 501, 505; 324/537, 755, 760; 437/248; 174/16.3

(56) References Cited

U.S. PATENT DOCUMENTS

| | | | | |
|---|---|---|---|---|
| 4,117,257 A | * | 9/1978 | Thomas ..................... 174/52 R |
| 4,812,733 A | * | 3/1989 | Tobey ......................... 323/285 |
| 5,210,424 A | * | 5/1993 | Gelzer et al. ............. 250/443.1 |
| 5,290,710 A | * | 3/1994 | Haj-Ali-Ahmadi et al. .... 437/8 |
| 5,612,677 A | * | 3/1997 | Baudry ........................ 340/584 |
| 5,676,199 A | * | 10/1997 | Lee ............................. 165/80.3 |
| 5,864,465 A | * | 1/1999 | Lin ............................. 361/697 |
| 5,911,897 A | * | 6/1999 | Hamilton ..................... 219/497 |
| 5,964,092 A | * | 10/1999 | Tozuka et al. ................. 62/3.7 |
| 6,288,371 B1 | * | 9/2001 | Hamilton et al. ........... 219/530 |

FOREIGN PATENT DOCUMENTS

| | | | | | |
|---|---|---|---|---|---|
| JP | 361171157 A | * | 8/1986 | ........... H01L/23/36 |
| JP | 362226646 A | * | 10/1987 | ........... H01L/23/36 |
| JP | 405223890 A | * | 9/1993 | ........... H01L/21/66 |
| JP | 02000291588 A | * | 10/2000 | ........... H05K/7/20 |

* cited by examiner

Primary Examiner—Darren Schuberg
Assistant Examiner—Michael Datskovsky
(74) Attorney, Agent, or Firm—Zagorin, O'Brien & Graham, LLP

(57) ABSTRACT

A temperature sensor for an integrated circuit is attached to a heat sink using a compliant member such as a spring. The spring attaches to the heat sink and extends across a slot in the thermal contact surface of the heat sink so that the temperature sensor coupled to the spring is centered nominally over an integrated circuit die when the heat sink is abutted against the integrated circuit.

25 Claims, 10 Drawing Sheets

TEMPERATURE SENSOR MOUNTING FOR ACCURATE MEASUREMENT AND DURABILITY

This application claims the benefit under 35 U.S.C. §1.19(e) of the provisional application entitled TEMPERATURE SENSOR MOUNTING FOR ACCURATE MEASUREMENT AND DURABILITY, application No., 60/250,275, filed Nov. 30, 2000, by Doug Markwardt et al., which is incorporated herein by reference in its entirety.

BACKGROUND OF THE INVENTION

1. Field of the Invention

This invention relates to measuring temperature of integrated circuits and more particularly to a temperature sensor utilized in combination with a heatsink.

2. Description of the Related Art

Processors and other components in modern electronic systems such as personal computers generate significant amounts of heat in operation and therefore require cooling to avoid potentially damaging overheating conditions. For integrated circuits such as processors heatsinks are provided to dissipate heat generated by the processor. Fans are typically utilized in conjunction with heatsinks to blow air on the fins of the heatsink to achieve greater cooling through convection.

In order to determine how much to cooling to apply an integrated circuit device such as a microprocessor, computer systems have typically regulated device temperature by turning a fan on or off, controlling clocks and/or controlling the voltage supplied to the device. In order to properly control temperature, a temperature sensor is utilized that measures the temperature of the integrated circuit so the system can take appropriate action to, e.g., turn on or off the fan, adjust the voltage, or adjust the frequency.

In a testing environment, such as a burn-in environment, in which tests are conducted at elevated temperatures, it can be even more important to obtain accurate thermal information. In certain test environments, it is desirable to hold die temperature within a predetermined range and the temperature sensor has to obtain an accurate die temperature if that goal is to be met. It is therefore desirable for the temperature sensor to be mounted so as to obtain an accurate die temperature. It is further desirable that assembly tolerances of the heatsink and temperature sensor be taken into account.

SUMMARY OF THE INVENTION

Accordingly, in order to accurately measure temperature of an integrated circuit device, a temperature sensor, e.g. a thermister, is attached to a compliant or resilient member such as a spring, which in turn is coupled to a heatsink. The heatsink includes a thermal contact surface having a recess. In one embodiment, the recess is a slot extending to an edge of the thermal contact surface. At least a portion of the spring is displaceable within the recess in response to a compressive force. The temperature sensor extends within the slot in the thermal contact surface of the heat sink so that the temperature sensor is centered nominally over the integrated circuit die when the heat sink is abutted against the semiconductor device. The compliant member exerts a force on the temperature sensor to ensure engagement of the temperature sensor with a semiconductor device when the thermal contact surface is abutted against the semiconductor device.

In an embodiment, the recess does not extend to the edge of the thermal contact surface and a high temperature silicone is disposed in the recess and acts as the compliant member. The high temperature silicone exerts a force on the temperature sensor to keep it engaged with a semiconductor device when the thermal contact surface is abutted against the semiconductor device. In addition, the high temperature silicone allows the temperature sensor to be displaced towards the recess when the thermal contact surface is abutted against the semiconductor device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
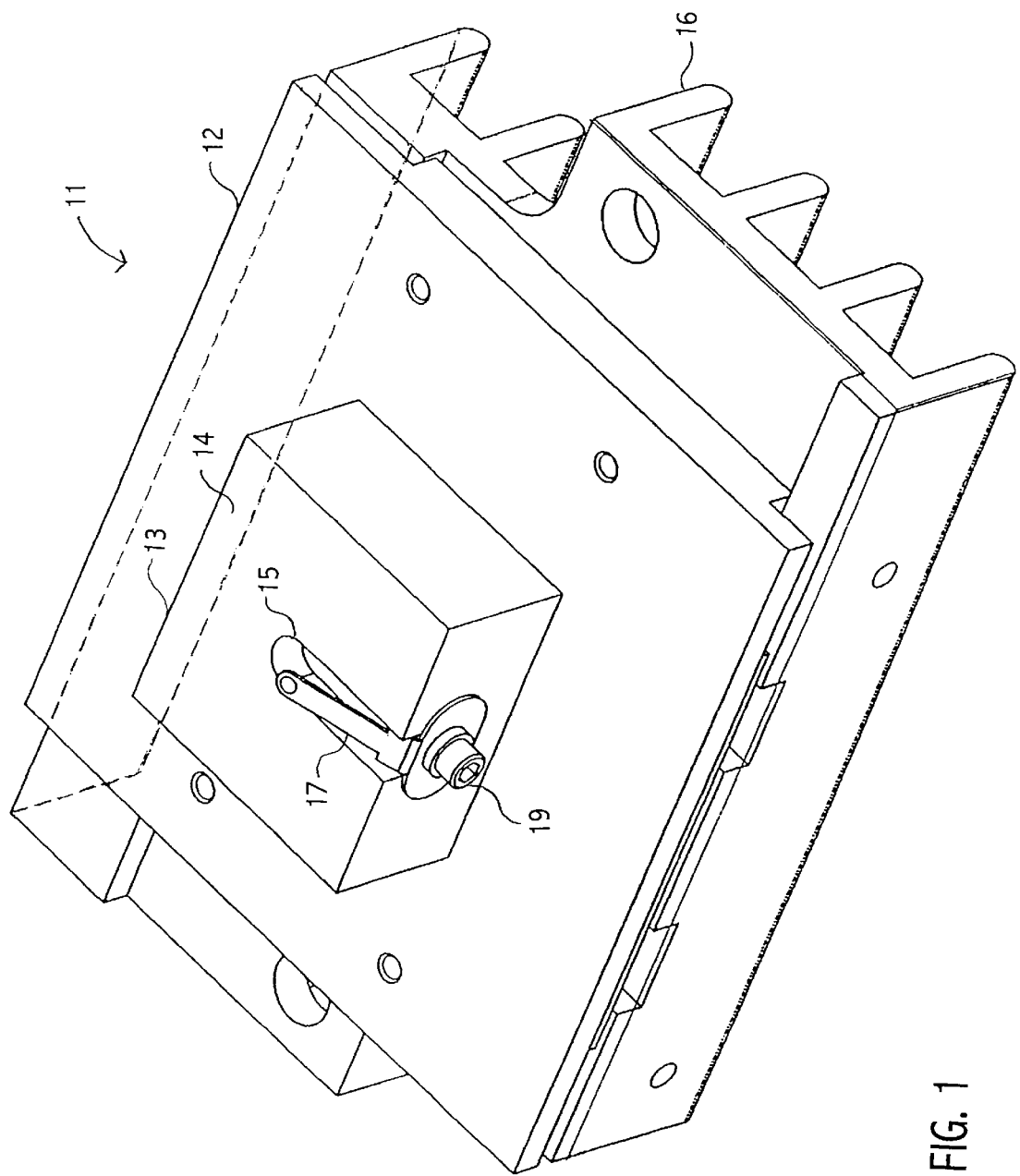
FIG. 1 illustrates a heatsink assembly and spring according to an embodiment of the invention.

Referring to FIG. 1 a heat sink assembly 11 is illustrated. Heat sink assembly 11 includes a base portion 12 that includes cubic portion 13. Cubic portion 13 has a surface 14 for thermal engagement with a semiconductor device. That engagement may be with the die directly, a portion of the package, a lid covering the die or other suitable portion of the semiconductor device in order to ensure appropriate thermal engagement with the semiconductor device requiring cooling. In an embodiment, a slot 15 is machined out of the cubic portion 13. The slot may of course be formed in any manner appropriate to the materials of the heatsink and the method of manufacture. Attached to a side of cubic portion 13 is a spring 17 that is a generally L-shaped cantilever spring. Spring 17 attaches to the cubic portion 13 of heatsink assembly 11 via screw 19. The spring 17 is preferably formed of a temperature resistive material such as BeCu. In addition a thermal compound or thermal conductive pad (not shown) is typically utilized on the thermal engagement surface 14 to ensure good thermal contact with a semiconductor device. Heatsink assembly 11 also includes a finned portion 16 as illustrated. Note that the slot 15 provides room for spring action of spring 17 and also isolates the temperature sensing device from the heatsink, thereby providing a more accurate temperature reading of the semiconductor device.

When a semiconductor device (not shown) is abutted against the heatsink, a force is exerted on the temperature sensor causing it to be displaced towards the slot sufficiently that the thermal contact surface 14 is engaged with the semiconductor device. The spring keeps the temperature sensor engaged with the semiconductor device.

Figure 2:
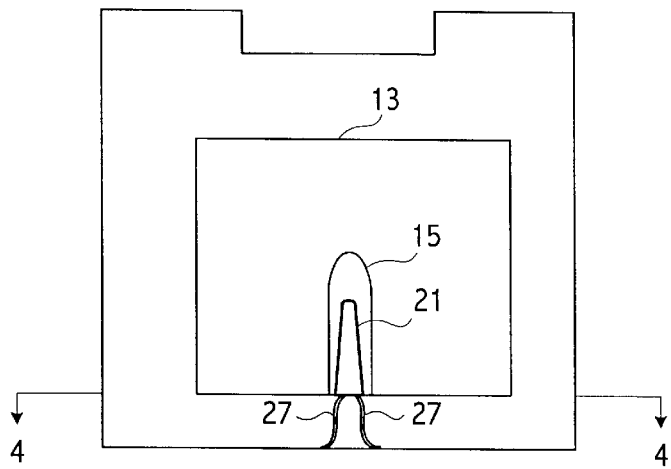
FIG. 2 illustrates a top view of a thermister and heatsink assembly according to an embodiment of the invention.

Referring to FIG. 2 a top view of the heatsink assembly and temperature sensor is shown. Within slot 15, a temperature sensor assembly 21 (described more fully below) is mounted on top of spring 17. Wires 27 extend from temperature sensor assembly 21.

Figure 3:
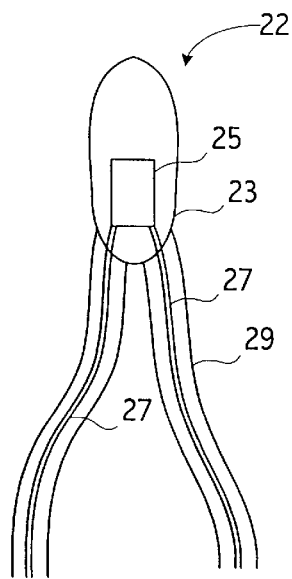
FIG. 3 illustrates an exemplary thermister that can be used in an embodiment of the invention.

FIG. 3 shows a more detailed view of a thermister that can be utilized as the temperature sensor in the temperature sensor assembly 21. The temperature sensor 22 is a thermister and includes a glass portion 23 surrounding the temperature sensing element 25. Wires 27 extend from the thermister. An insulation material such as Teflon tubing 29 is inserted over each of the wires 27 leading to and from the thermister.

Figure 4:
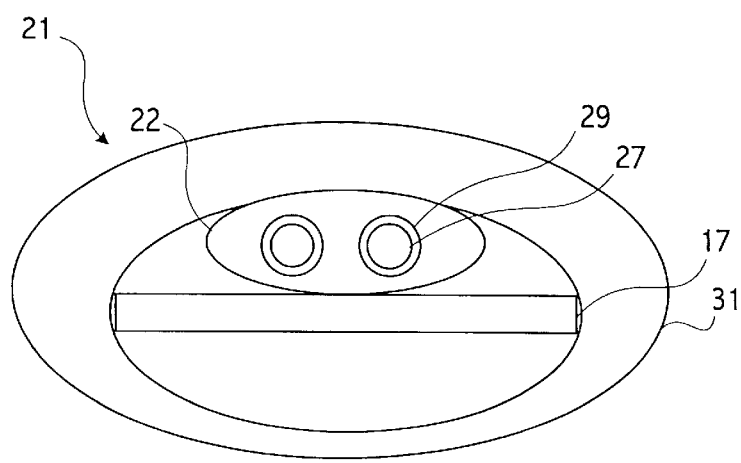
FIG. 4 illustrates a cross sectional view showing how the thermister is attached to the spring.

Referring to FIG. 4, a side view of an embodiment of temperature sensor assembly 21 is shown. In the illustrated embodiment, the temperature sensor assembly 21 includes the thermister 22 mounted on spring 17. In addition, the temperature sensor assembly 21 includes heat shrink tubing 31 that secures the thermister 22 to a portion of the spring 17 by securing a portion of wires 27 to the spring 17. The heat shrink tubing 31 securing wires 27 is sufficient to maintain the thermister in place.

Figure 5:
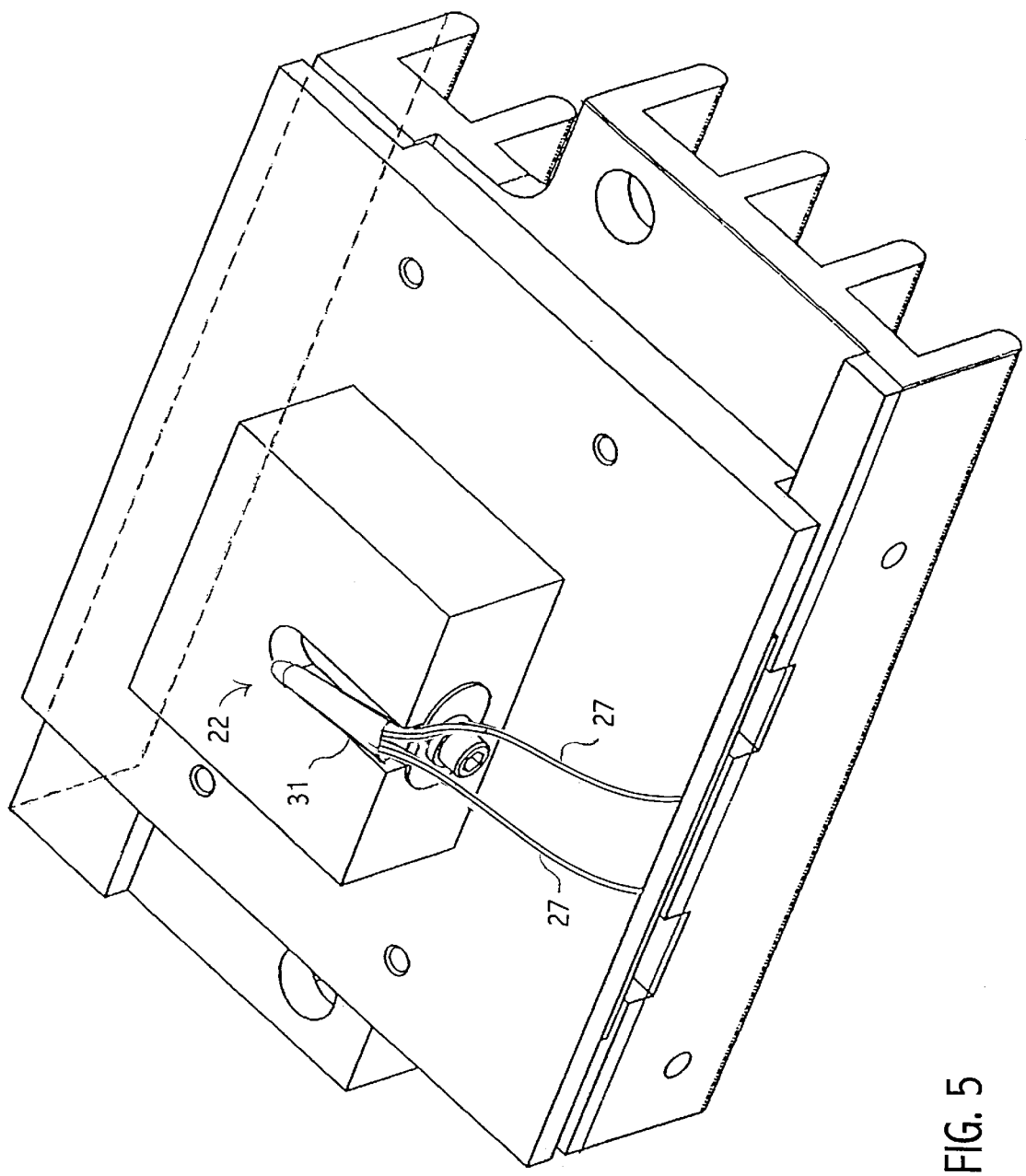
FIG. 5 shows the heatsink assembly of FIG. 1 with the thermister mounted on the spring.

Referring to FIG. 5, the heatsink assembly shown in FIG. 1 is shown with a thermister 22 mounted to the spring with heatshrink tubing 31. Wires 27 extend from the thermister 22. As can be seen in FIG. 5, the glass portion 25 of the thermister extends from the end of the tubing to thermally engage the semiconductor device.

Figure 6:
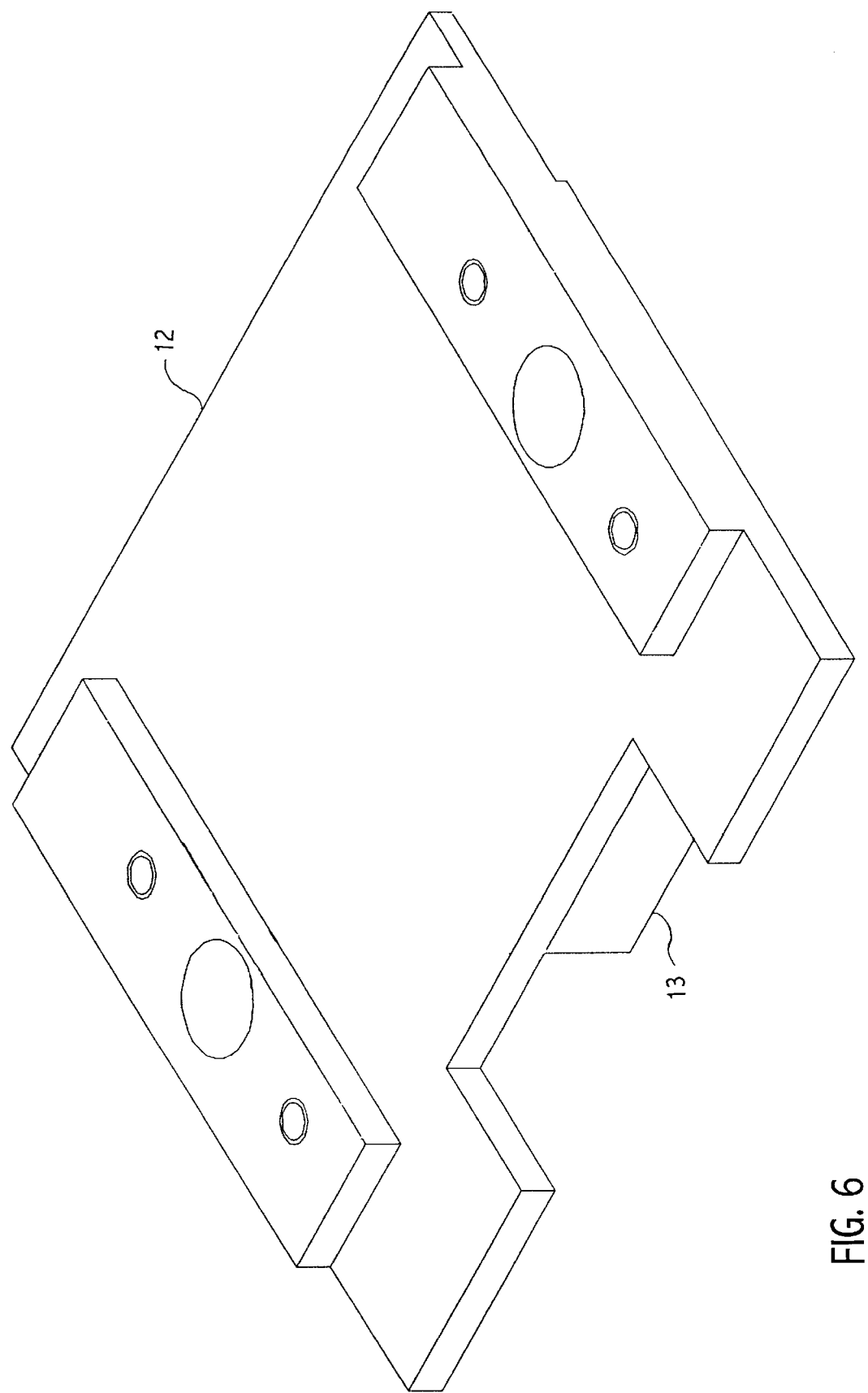
FIG. 6 illustrates a top view of a base portion of a heatsink assembly according to an embodiment of the invention.
Figure 7:
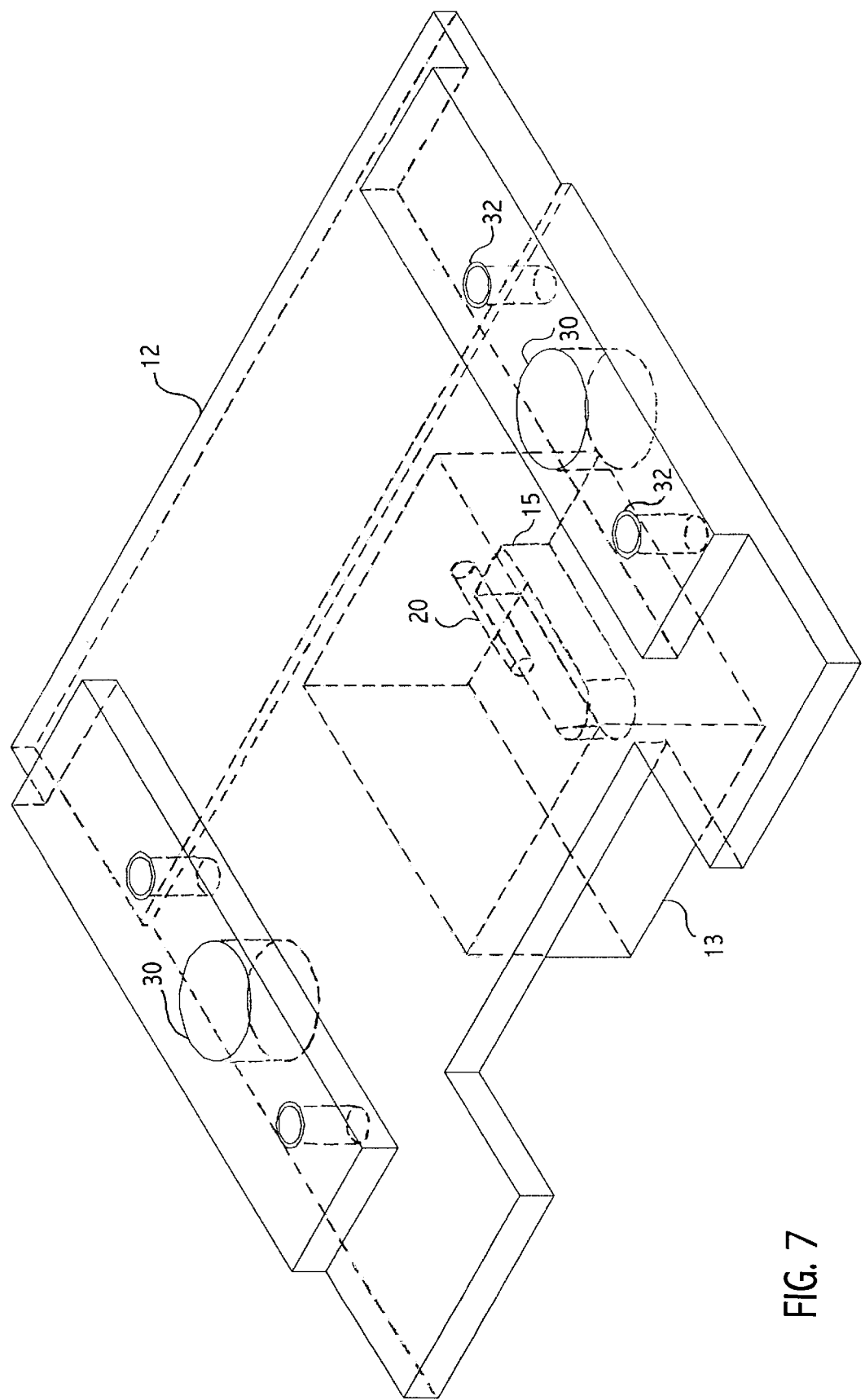
FIG. 7 illustrates the same view as FIG. 6 except the hidden features are illustrated in dashed lines.

Referring to FIG. 6 a different view of a base portion 12 is shown. The cubic portion 13 can be seen extending downward from the base portion. Note that the base portion 12 differs by having a slightly different form than the base portion illustrated in FIG. 1. FIG. 7 illustrates the same view as FIG. 6 except the portions hidden from view are illustrated in dashed lines. Thus, slot 15 can be seen along with a screw hole 20 for receiving the screw 19 illustrated in FIG. 1. Various other screw holes are illustrated for assembly with a finned portion (holes 32) or attachment to a socket (holes 30).

Figure 8:
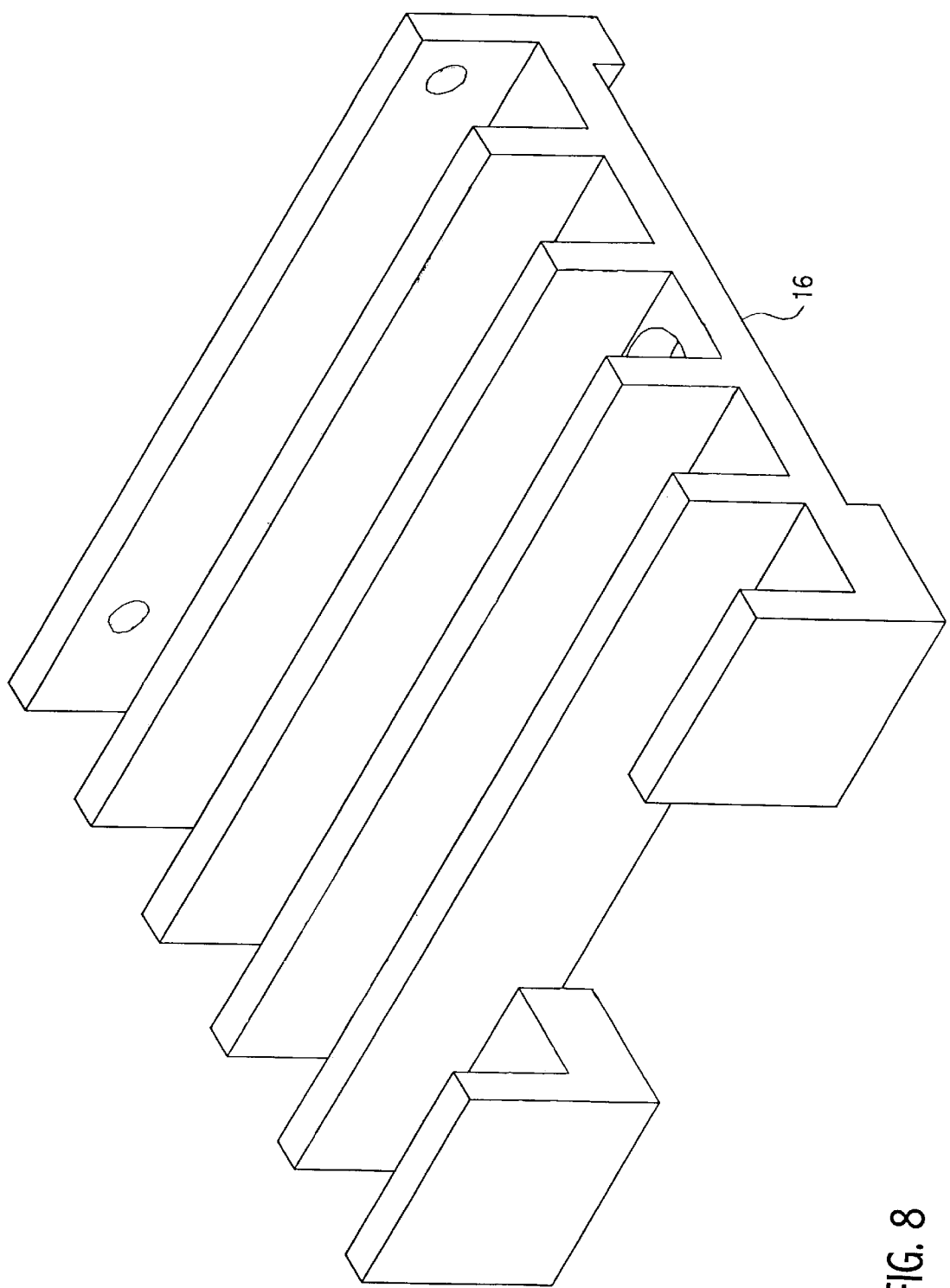
FIG. 8 shows a finned portion of a heatsink assembly that couples to the base portion shown in FIGS. 6 and 7.
Figure 9:
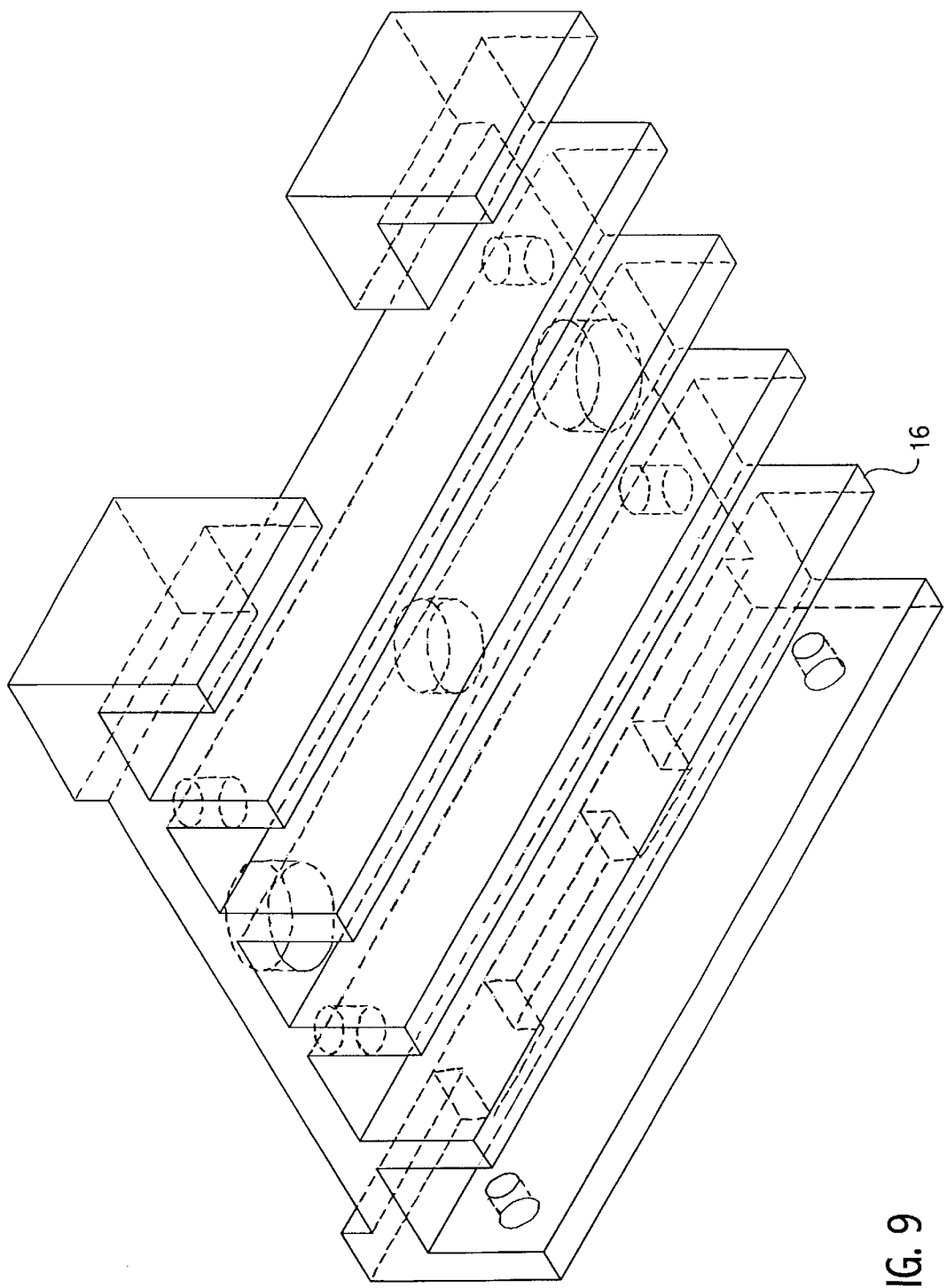
FIG. 9 illustrates the same view as FIG. 8 except the hidden features are illustrated in dashed lines.

Referring to FIG. 8, a finned portion 16 of a heatsink assembly is illustrated in another view. FIG. 9 illustrates the same view as FIG. 8 except the portions hidden from view are illustrated in dashed lines. Thus, the various screw holes are illustrated for coupling to the base portion 12 or a socket.

Figure 10:
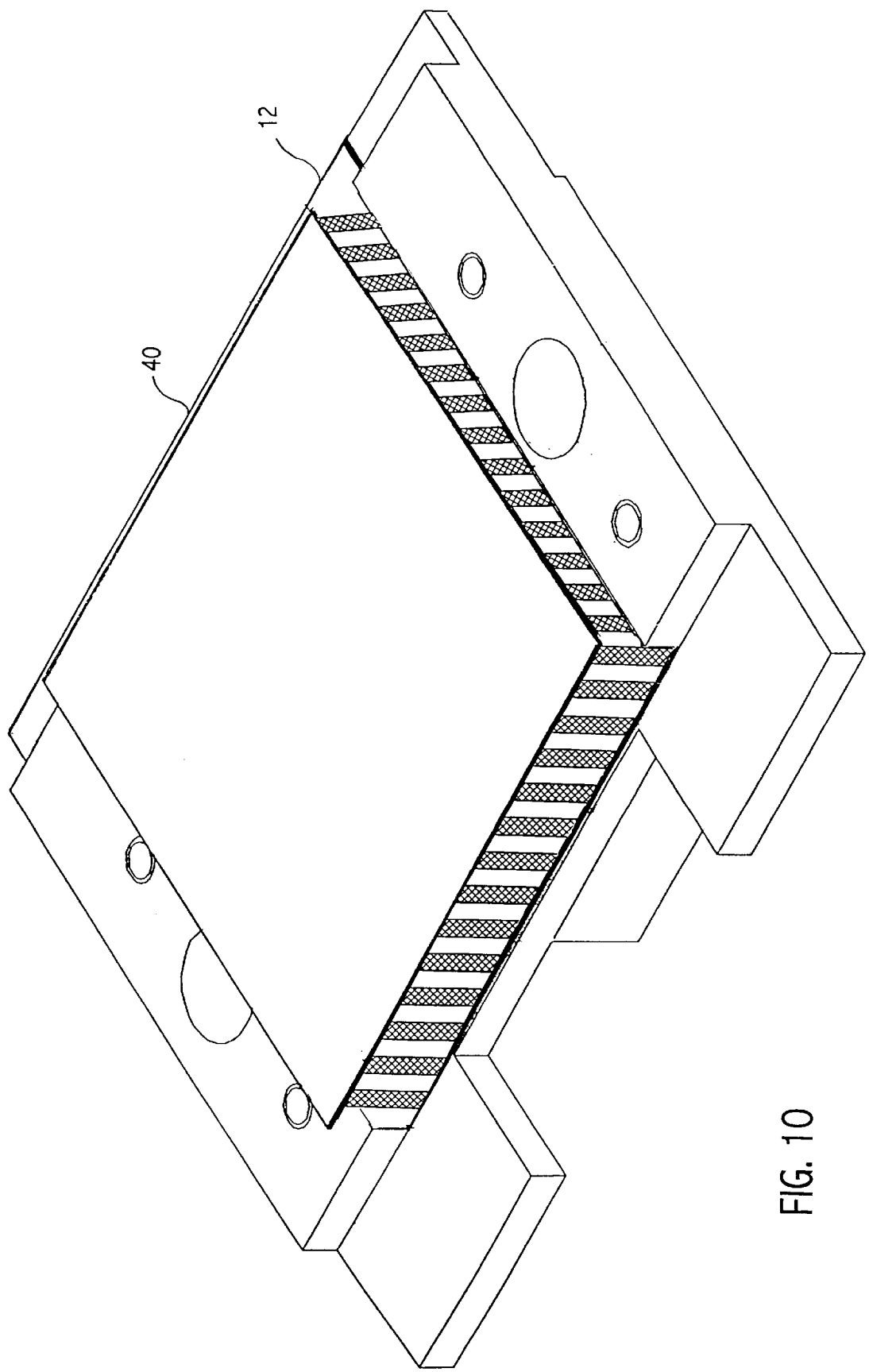
FIG. 10 illustrates use of a thermal electric cooler (TEC) between the base portion and finned portion of a heatsink assembly according to an embodiment of the invention.

In order to provide additional cooling for some applications, a thermal electric cooler (TEC) may be utilized. Referring to FIG. 10, TEC 40 is placed on the base portion 12 shown in FIG. 6. The finned portion 16 illustrated in FIG. 8 mounts on top of TEC 40 when coupled to base portion 12.

Figure 11:
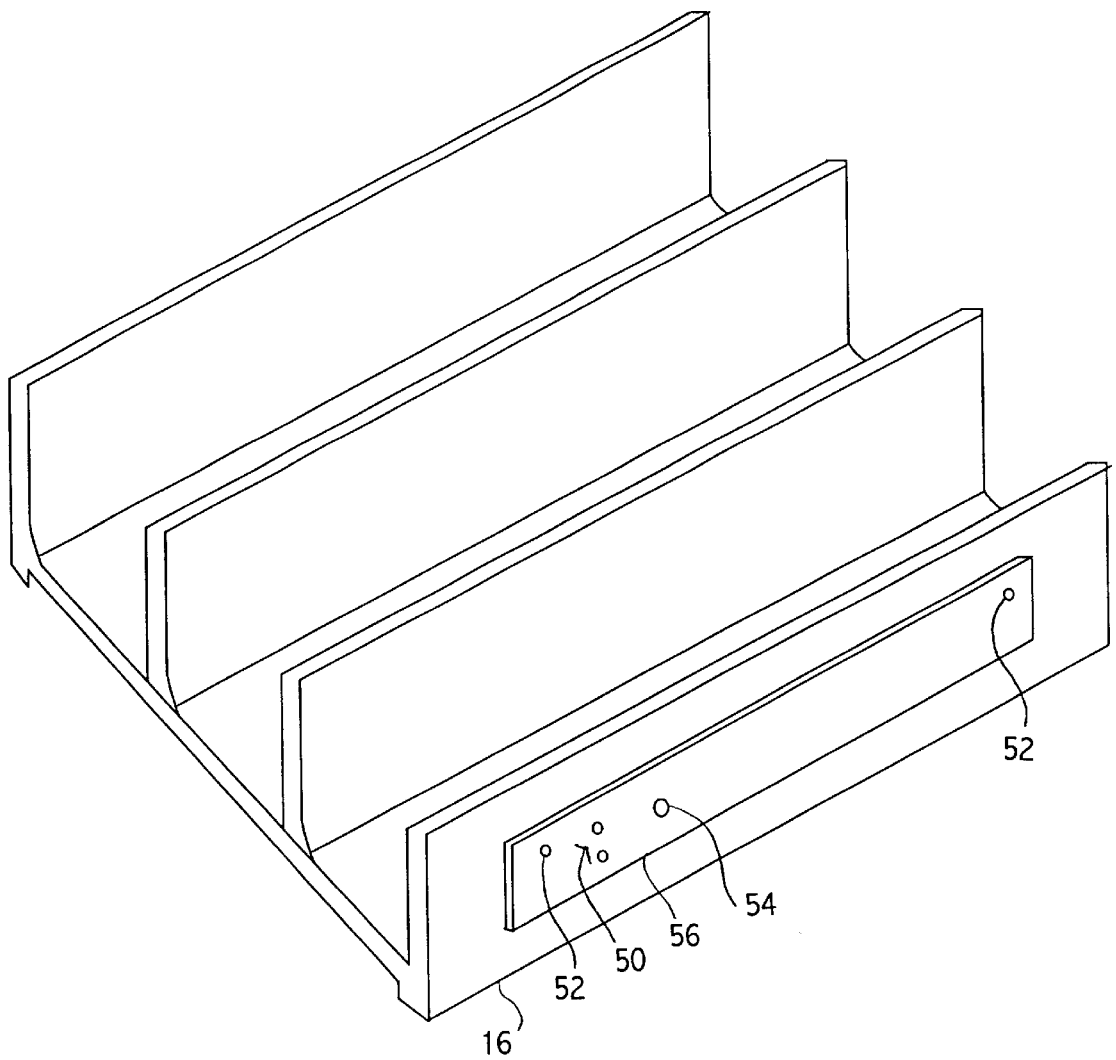
FIG. 11 illustrates a printed circuit (PC) board mounted to a finned portion of a heatsink assembly according to an embodiment of the invention.

Referring to FIG. 11, in an embodiment of the invention, a printed circuit (PC) board 50 is mounted to the side of a finned portion 16 of a heatsink assembly via screws 52. The PC board may be used to terminate the wires from the thermister and/or the TEC. The wires may be terminated in a four-pin header or may be terminated in a short harness with an appropriate connector on the end of the harness. In an embodiment, a through hole 54 is provided for wiring as well as through holes 56 for a wiring tie. In an embodiment with a TEC the wiring for the TEC may also be provided in the header and/or harness assembly.

Figure 12:
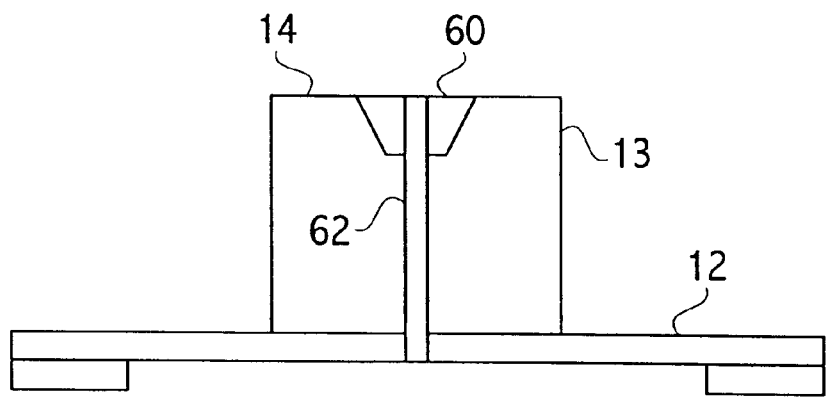
FIG. 12 illustrates a side view of another embodiment of the invention.

Referring to FIG. 12, another embodiment of the invention is shown in which a high temperature silicone is used as a compliant member rather than a spring. FIG. 12 illustrates a side view of a base portion 12. A recess 60 is formed in the thermal contact surface 14 of cubic portion 13. In this embodiment, the recessed portion, which does not go to the edge of the cubic portion 13, is filled with high temperature silicone. In addition a through hole 62 is provided through the cubic portion 13 as a wiring channel for the thermister wires.

Figure 13:
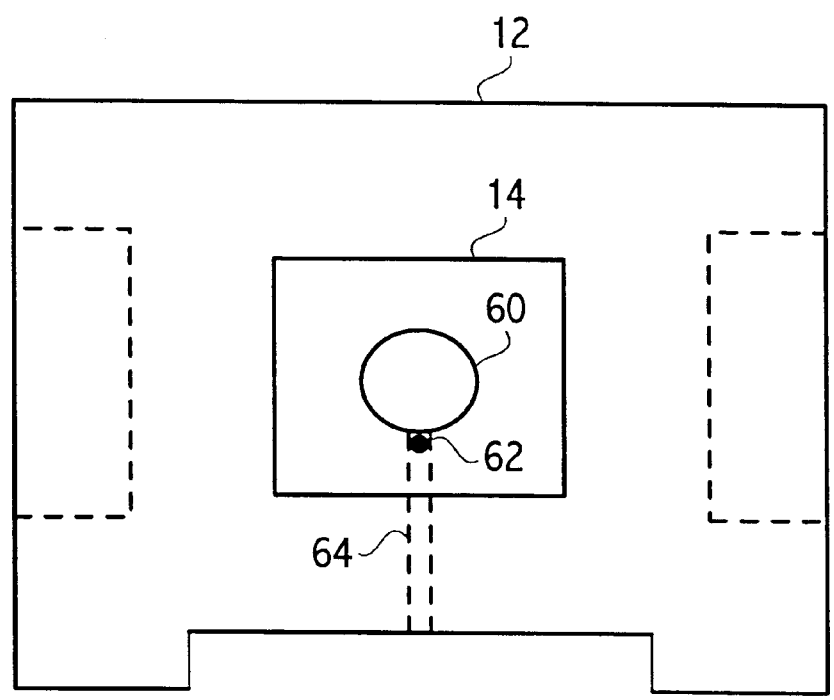
FIG. 13 illustrates a top view of the embodiment illustrated in FIG. 12.

FIG. 13 shows a top view of the embodiment shown in FIG. 12. In FIG. 13, the recess is 60 is shown adjacent to through hole 62. The thermister (not shown) is disposed on the high temperature silicone and its wires are run down wiring channel 62. The thermister is again preferably disposed so as to be nominally centered over the semiconductor die when engaged. While no force is exerted on it, the thermister is nominally above the recess. When the semiconductor is abutted against the heatsink, a force is exerted on the thermister causing it to be displaced towards the recess filled with the silicone sufficiently such that the thermal contact surface 14 is engaged with the semiconductor device. The nature of the high temperature silicone allows the silicone to stay within recess 60 without additional mechanical coupling. The silicone exerts a sufficient force on the thermister to ensure that it stays engaged with the semiconductor device. A wiring channel is also provided in groove 64 on the opposite side of the base portion 12 from the thermal contact surface. That wiring channel allows a thermister to be mounted flush against the surface of the base 12.

Note that the embodiments described herein provide both durability and assembly tolerances for the heatsink and temperate sensor. For example, a greater manufacturing tolerance is acceptable since the spring ensures appropriate thermal engagement of the thermister to the semiconductor die. Additionally, since the thermal compound on the thermal engagement surface of the heatsink tends to wear, the spring ensures that the thermister is still engaged with the semiconductor device in spite of the wear. In that way accurate temperature measurements can be ensured for a longer period of time.

Thus, an apparatus has been described that provides for accurate measurement of a semiconductor device using a temperature sensor coupled to a compliant member such as a spring. The embodiments described herein not only ensure the temperature sensor is abutted against the device whose temperature is being measured, but the use of the spring ensures that an effective temperature measurement can be achieved even with the expected manufacturing tolerances of the heatsink assembly, as well as expected wear. Note that the description of the invention set forth herein is illustrative, and is not intended to limit the scope of the invention as set forth in the following claims. For instance while springs and silicone have been described in the preferred embodiments other compliant members could be used. In addition other variations and modifications of the embodiments disclosed herein, may be made based on the description set forth herein, without departing from the scope and spirit of the invention as set forth in the following claims.

What is claimed is:

1. An apparatus comprising:
   a heatsink having a thermal contact surface, the heatsink including a recessed portion in the thermal contact surface;
   a compliant member coupled to the heatsink, at least a portion of the compliant member being displaceable within the recessed portion in response to a compressive force;
   a temperature sensor, the compliant member exerting a force on the temperature sensor to ensure engagement of the temperature sensor with a semiconductor device when the thermal contact surface is abutted against the semiconductor device; and
   wherein the recessed portion is a slot extending to an edge of the thermal contact surface and the compliant member and the temperature sensor extend within the slot placed in the heatsink to nominally center the temperature sensor over a semiconductor device when the thermal contact surface is abutted against the semiconductor device.

2. An apparatus comprising:
   a heatsink having a thermal contact surface, the heatsink including a recessed portion in the thermal contact surface;
   a compliant member coupled to the heatsink, at least a portion of the compliant member being displaceable within the recessed portion in response to a compressive force;
   a temperature sensor, the compliant member exerting a force on the temperature sensor to ensure engagement of the temperature sensor with a semiconductor device when the thermal contact surface is abutted against the semiconductor device; and wherein the compliant member is a spring mounted to a side of the heatsink.

3. The apparatus as recited in claim 2 wherein the compliant member is a generally L-shaped cantilever spring, with one leg of the L attached to a side of the heat sink and a second leg of the L disposed in the slot of the heat sink, the second leg of the L being coupled to the temperature sensor.

4. The apparatus as recited in claim 1 wherein the compliant member is a spring and the temperature sensor is a thermister.

5. The apparatus as recited in claim 4 further comprising heat shrink tubing coupling thermister wires to the spring thereby coupling the thermister to the spring.

6. The apparatus as recited in claim 1 wherein the temperature sensor is nominally disposed above the recessed portion when the thermal contact surface is not abutted against the semiconductor device.

7. The apparatus as recited in claim 1 wherein wires extending from the temperature sensing device are covered in insulation.

8. The apparatus as recited in claim 1 wherein the compliant member is a BeCu spring.

9. The apparatus as recited in claim 1 wherein the heatsink is part of a heatsink assembly including cooling fins thermally coupled to the heatsink thermal contact surface.

10. The apparatus as recited in claim 9 further comprising a thermal electric cooler (TEC) disposed within the heatsink assembly.

11. The apparatus as recited in claim 9 further comprising a printed circuit board coupled to one of the cooling fins of the heatsink assembly, the wires from the temperature sensor being terminated in the printed circuit board.

12. The apparatus as recited in claim 11 further comprising a thermal electric cooler (TEC) disposed within the heatsink assembly.

13. The apparatus as recited in claim 12 wherein wires from the thermal electric cooler are terminated in the printed circuit board.

14. The apparatus as recited in claim 1 wherein the temperature sensor is isolated from the heatsink by air in the recessed portion of the heatsink, thereby providing a more accurate temperature reading of the semiconductor device.

15. The apparatus as recited in claim 1 wherein the compliant member is high temperature silicone, the high temperature silicone disposed in the recessed portion in the heatsink.

16. The apparatus as recited in claim 15 wherein the heatsink includes a through hole through a base portion, the through hole providing a wiring channel for wiring of the temperature sensor.

17. An apparatus comprising:
    a heatsink;
    a temperature sensor for sensing temperature of a semiconductor device; and
    means coupled to an outer side of the heatsink, normal to a heat transfer surface, for keeping the temperature sensor abutted against the semiconductor device.

18. A heatsink comprising:
    a base portion including a surface portion for thermal engagement with a semiconductor device;
    a wiring channel formed in a second surface of the base portion, the second surface being opposite the surface portion for thermal engagement, thereby allowing a thermal electric cooler (TEC) to be mounted flush against the second surface of the base portion; and
    wherein the base portion includes a recessed area in the surface portion to allow for displacement for a temperature sensor when the base portion is thermally engaged with the semiconductor device; and wherein the recessed area is a slot extending to an edge of the surface portion.

19. The heatsink as recited in claim 18 further comprising a finned portion.

20. The heatsink as recited in claim 18 further comprising a through hole extending from the surface portion for thermal engagement to a second surface of the base portion, the second surface being opposite the surface portion for thermal engagement, thereby providing a wiring channel for wires of the temperature sensor.

21. An apparatus comprising:
    a heatsink having a thermal contact surface, the heatsink including a recessed portion in the thermal contact surface;
    a compliant member disposed in the recessed portion, the compliant member being displaceable within the recessed portion in response to a compressive force; and
    a temperature sensor, the compliant member exerting a force on the temperature sensor to ensure engagement of the temperature sensor with a semiconductor device when the thermal contact surface is abutted against the semiconductor device; and wherein the compliant member is formed of high temperature silicone.

22. The apparatus as recited in claim 21 wherein the heatsink includes a through hole through a base portion, the through hole providing a wiring channel for wiring of the temperature sensor.

23. The apparatus as recited in claim 22 wherein the base portion includes a wiring channel on a second side opposite a first side with the thermal contact surface, thereby allowing a thermal electric cooler (TEC) to engage the second side of the base portion without being disrupted by a wire.

24. A method comprising:

forming a recess in a thermal contact surface of a heatsink;

securing a compliant member to the heatsink such that the compliant member is displaceable within the recessed portion in response to a compressive force, wherein the compliant member is formed of high temperature silicone; and causing the compliant member to act upon a temperature sensor to cause the engagement of the temperature sensor with a semiconductor device when the thermal contact surface is abutted against the semiconductor device.

25. The method as recited in claim 24 wherein the compliant member is a spring and further comprising:

attaching the spring to the heat sink; and coupling the temperature sensor to the spring.

* * * * *